United States Patent
Vemulapati et al.

(10) Patent No.: US 10,868,532 B2
(45) Date of Patent: Dec. 15, 2020

(54) VEHICLE TRIM ASSEMBLY HAVING SENSOR AND GROUNDED TRIM COMPONENT

(71) Applicant: Ford Global Technologies, LLC, Dearborn, MI (US)

(72) Inventors: Satyanarayana Raju Vemulapati, Westland, MI (US); Matthew Anthony Majkowski, Dearborn, MI (US); Steven J. Antilla, Brighton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 253 days.

(21) Appl. No.: 16/128,856

(22) Filed: Sep. 12, 2018

(65) Prior Publication Data

US 2020/0083886 A1    Mar. 12, 2020

(51) Int. Cl.
| | | |
|---|---|---|
| *H03K 17/955* | (2006.01) | |
| *B60Q 3/82* | (2017.01) | |
| *B60R 13/02* | (2006.01) | |
| *H03K 17/96* | (2006.01) | |

(52) U.S. Cl.
CPC ............. *H03K 17/955* (2013.01); *B60Q 3/82* (2017.02); *B60R 13/0212* (2013.01); *H03K 17/962* (2013.01)

(58) Field of Classification Search
None
See application file for complete search history.

(56) References Cited

U.S. PATENT DOCUMENTS

| | | | |
|---|---|---|---|
| 6,774,505 | B1 | 8/2004 | Wnuk |
| 8,816,985 | B1 | 8/2014 | Tate et al. |
| 8,859,922 | B1 | 10/2014 | Sage et al. |
| 8,933,708 | B2 | 1/2015 | Buttolo et al. |
| 9,333,698 | B2 | 5/2016 | DeVries et al. |
| 9,641,172 | B2 | 5/2017 | Salter et al. |
| 2006/0245200 | A1 | 11/2006 | Kuwana et al. |
| 2010/0259282 | A1 | 10/2010 | Niwa et al. |
| 2012/0048708 | A1 | 3/2012 | Salter et al. |
| 2013/0027349 | A1 | 1/2013 | Sanatarossa |
| 2013/0271204 | A1 | 10/2013 | Salter et al. |
| 2014/0002405 | A1 | 1/2014 | Salter et al. |

(Continued)

FOREIGN PATENT DOCUMENTS

| | | |
|---|---|---|
| CN | 103265811 A | 8/2013 |
| CN | 103554900 A | 2/2014 |

OTHER PUBLICATIONS

"Touch Sensors Design Guide" by Atmel, 10620 D-AT42-04/09, Revised Apr. 2009, 72 pages, Copyrighted 2008-2009 Atmel Corporation.

(Continued)

*Primary Examiner* — Jared Fureman
*Assistant Examiner* — Aqeel H Bukhari
(74) *Attorney, Agent, or Firm* — David Coppiellie; Price Heneveld LLP

(57) ABSTRACT

A vehicle trim assembly is provided that includes a proximity sensor, a first conductive trim component located near the proximity sensor, a second conductive trim component located near the proximity sensor, and a conductive tower formed on the first conductive trim component and electrically coupled to the second trim component to form a conductive path between the trim components and electrical ground.

16 Claims, 8 Drawing Sheets

(56) References Cited

U.S. PATENT DOCUMENTS

| | | |
|---|---|---|
| 2014/0252879 A1 | 9/2014 | Dassanayake et al. |
| 2014/0306723 A1 | 10/2014 | Salter et al. |
| 2014/0306724 A1 | 10/2014 | Dassanayake et al. |
| 2015/0001060 A1 | 1/2015 | Kim et al. |
| 2015/0062941 A1* | 3/2015 | Sura ............... B60Q 3/82 362/488 |
| 2015/0180471 A1 | 6/2015 | Buttolo et al. |
| 2015/0229305 A1* | 8/2015 | Buttolo ............ B60R 16/02 307/9.1 |
| 2016/0112044 A1 | 4/2016 | Salter et al. |
| 2016/0274664 A1 | 9/2016 | Buttolo et al. |
| 2016/0344386 A1 | 11/2016 | Buttolo et al. |
| 2017/0106564 A1 | 4/2017 | Hwang et al. |
| 2017/0178837 A1 | 6/2017 | Jeong |
| 2017/0192552 A1 | 7/2017 | Graf |
| 2018/0265043 A1 | 9/2018 | Salter et al. |
| 2018/0297513 A1 | 10/2018 | Salter et al. |
| 2018/0302088 A1 | 10/2018 | Majkowski et al. |
| 2018/0319331 A1 | 11/2018 | Salter et al. |
| 2019/0202376 A1 | 7/2019 | Salter et al. |

OTHER PUBLICATIONS

Jim Skelly, Technically Speaking, "Decorative Plating Processes for Common Plastic Resins," Jun. 2008, pp. 61-65, Lufkin, Texas.

\* cited by examiner

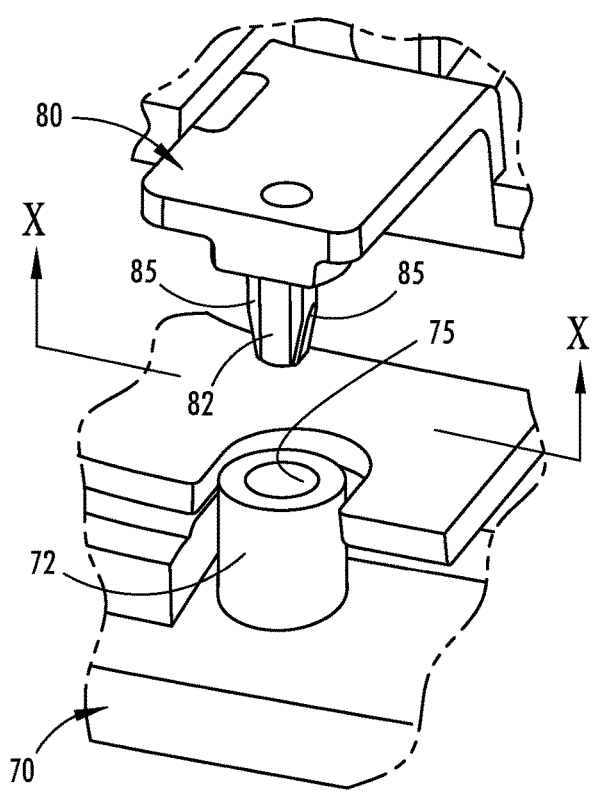
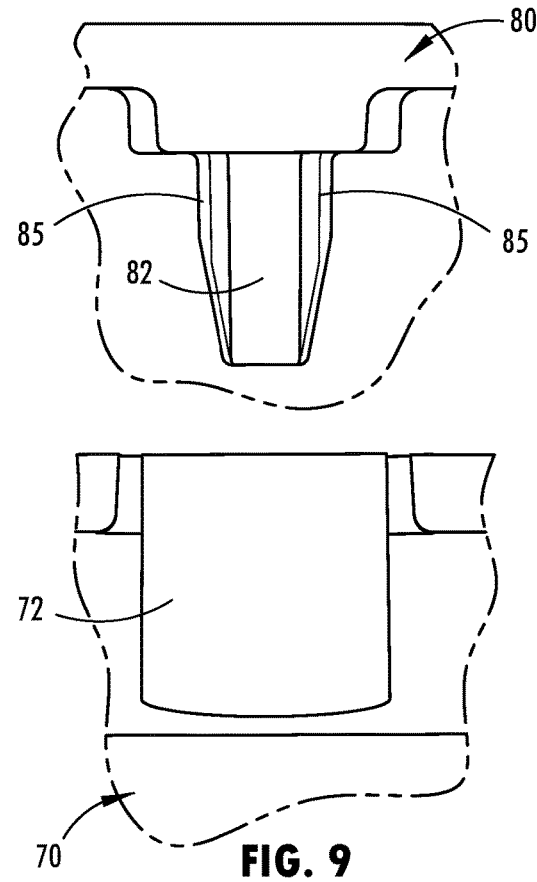
FIG. 8
FIG. 9
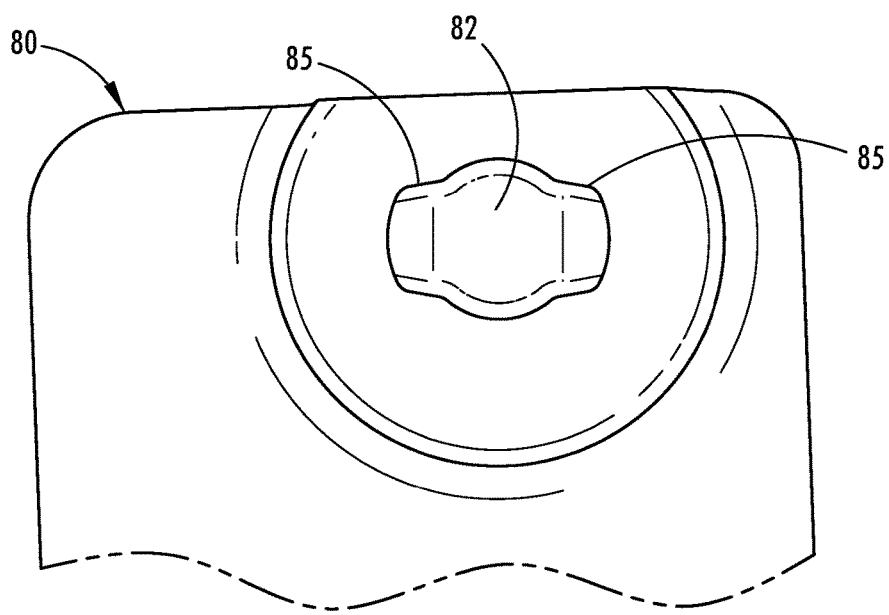
FIG. 10

VEHICLE TRIM ASSEMBLY HAVING SENSOR AND GROUNDED TRIM COMPONENT

FIELD OF THE INVENTION

The present invention generally relates to vehicle trim and sensor assemblies, and more particularly relates to a vehicle trim assembly having a proximity sensor and grounded trim components.

BACKGROUND OF THE INVENTION

Vehicle consoles, such as overhead consoles, typically have a trim assembly which has vehicle controls including activation buttons for lights, climate control settings, sound systems, and other vehicle features. Some activation buttons may include proximity switches, such as capacitive switches that generate an electric field. Proximity switches may be employed for operating interior map and dome lighting, moonroofs and other various devices onboard the vehicle. Capacitive switches typically employ one or more capacitive sensors to generate an electric activation field. To enhance the decorative look and the sensing touch area for the switches, the vehicle console may be equipped with one or more trim components. The presence of a conductive trim component such as a chrome ring may interfere with the electric field generated by the capacitive sensor. It may be desirable to provide for a trim assembly that provides for a decorative look and does not interfere with operation of the capacitive sensor.

SUMMARY OF THE INVENTION

According to one aspect of the present invention, a vehicle trim assembly is provided. The vehicle trim assembly includes a proximity sensor, a first conductive trim component located near the proximity sensor, a second conductive trim component located near the proximity sensor, and a conductive tower formed on the first conductive trim component and electrically coupled to the second trim component to form a conductive path between the trim components and electrical ground.

Embodiments of the first aspect of the invention can include any one or a combination of the following features:
- the first decorative conductive trim component comprises an inner trim ring and the second decorative trim component comprises an outer ring that surrounds the inner ring;
- the inner trim ring substantially surrounds a sensing pad of the proximity sensor;
- the trim assembly further includes a conductive cup formed on the second conductive trim component, wherein the conductive tower is matingly received in the conductive cup;
- the conductive tower comprises a plurality of tapered ribs;
- the proximity sensor comprises a capacitive sensor;
- the proximity sensor is configured as a proximity switch to control a lamp, and wherein the proximity sensor is located on a lens of the lamp and the lens provides a sensing pad;
- the first and second decorative conductive trim components each comprise chrome; and
- the chrome is chrome plating.

According to another aspect of the present invention, a vehicle trim assembly is provided. The vehicle trim assembly includes a proximity sensor proximate a sensing pad, an inner conductive trim component surrounding the proximity sensor, an outer conductive trim component surrounding the inner conductive trim component, and a conductive tower connecting the first trim component to the second trim component to form a conductive path between the trim components and ground.

Embodiments of the second aspect of the invention can include any one or a combination of the following features:
- the conductive tower is formed as part of one of the first and second trim components;
- the conductive tower connects to a conductive cup on the other of the first and second trim components;
- the conductive tower comprises a plurality of tapered ribs;
- the proximity sensor comprises a capacitive sensor;
- the proximity sensor is configured as a proximity switch to control a vehicle lamp;
- the proximity sensor is located on a lens of the lamp and the lens provides the sensing pad;
- each of the first and second conductive trim components comprise chrome; and
- the chrome is chrome plating.

According to yet another aspect of the present invention, a vehicle trim assembly is provided. The vehicle trim assembly includes a proximity sensor proximate a sensing pad, an inner conductive trim component surrounding the proximity sensor, an outer conductive trim component surrounding the inner conductive trim component, a conductive tower electrically formed on to the first trim component, and a conductive cup formed on the second trim component and electrically connected to the tower to form a conductive path between the trim components and ground.

An embodiment of the third aspect of the invention can include any one or a combination of the following features:
- the first trim component comprises a trim ring that substantially surrounds the sensing pad and the second conductive trim component surrounds the first trim component, wherein the tower is snap-fit into the cup.

These and other aspects, objects, and features of the present invention will be understood and appreciated by those skilled in the art upon studying the following specification, claims, and appended drawings.

BRIEF DESCRIPTION OF THE DRAWINGS

In the drawings:

FIG. 8 is a perspective view of the conductive connector tower exploded from the connection to the outer trim component;

FIG. 9 is a front view of the conductive connector tower exploded from the connector cup on the outer trim component;

FIG. 10 is a bottom view of the conductive connector tower;

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
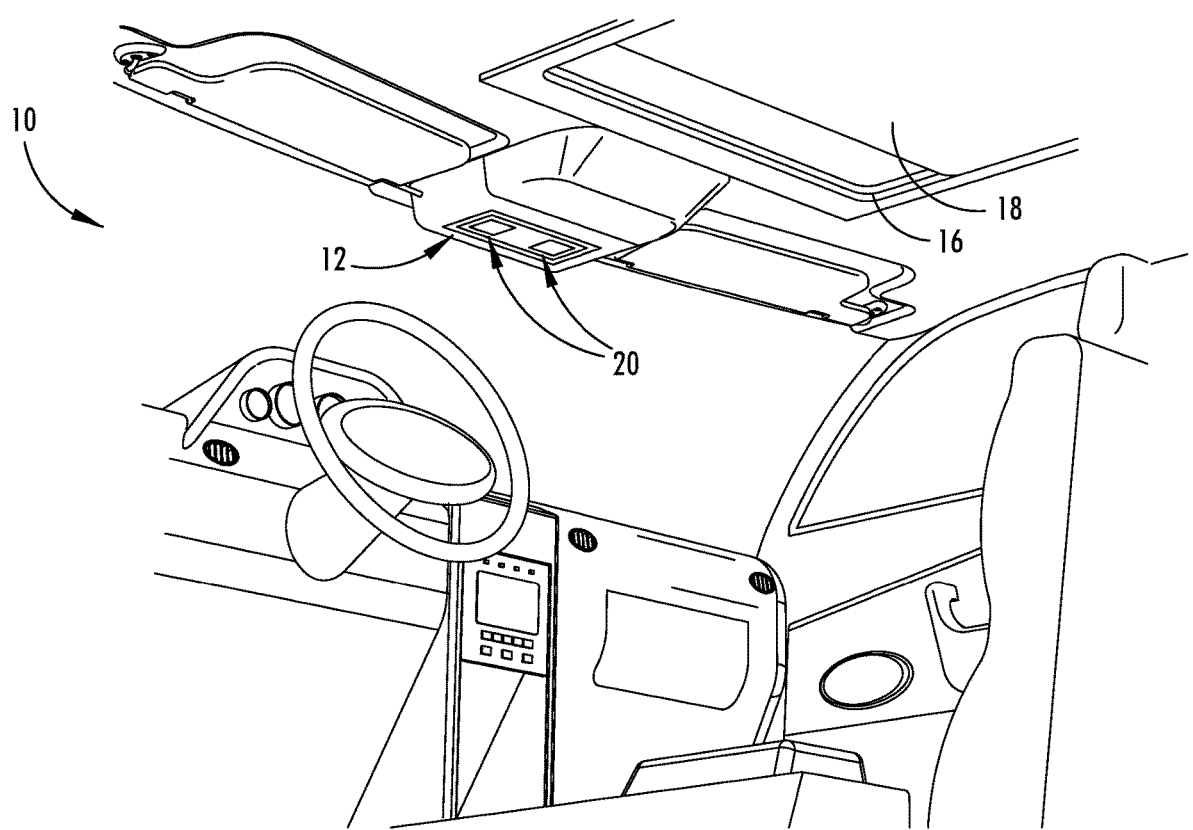
FIG. 1 is a perspective view of a passenger compartment of a motor vehicle having an overhead console trim assembly with conductive inner and outer trim components, such as chrome rings, and proximity sensors for activating lamp assemblies, according to one embodiment.
Figure 2:
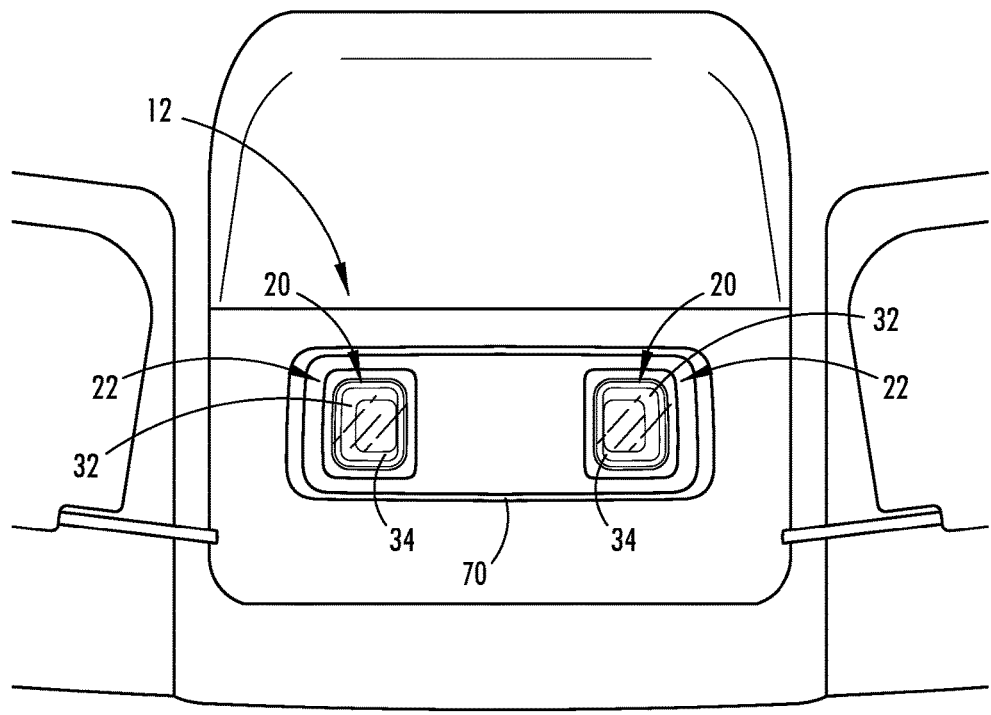
FIG. 2 is an enlarged view of the overhead console trim assembly further illustrating the trim components and lamp assemblies shown in FIG. 1.

Referring to FIGS. 1 and 2, the interior passenger compartment of a motor vehicle 10 is generally illustrated having an overhead console trim assembly 12 with a pair of lamp assemblies 20, each configured to include a proximity switch 22 having a proximity sensor, according to one embodiment. The vehicle 10 shown generally includes the overhead console trim assembly 12 assembled to the headliner on the underside of the roof or ceiling at the top of the vehicle passenger compartment, generally above the front passenger seating area. Each of the pair of lamp assemblies 20 provides an integral assembly of a lamp and a proximity switch 22 for activating a light source of the lamp to turn the lamp on and off. Each lamp assembly 20 includes an outer lens 32 having a transparent window, a light source disposed behind the outer lens 32 to illuminate light through the transparent window of the lens 32, and a proximity switch 22 having one or more proximity sensors disposed on or near the transparent window of the outer lens 32 and generating an activation field proximate to the outer lens 32 to sense activation of the proximity switch 22 to control activation of the light source. In the embodiment shown, the proximity switch 22 is integrally assembled as part of the lamp assembly 20 in which the central portion, including the transparent window, of the outer lens 32 serves as a touch or sensing pad 34. The user may contact the sensing pad 34 or come into close proximity therewith to be detected by the activation field. However, it should be appreciated that the proximity switch 22 may be assembled proximate one or more conductive trim components but separate from the lamp assembly 20 and employ its own sensing pad and may control any of a number of devices or functions.

A user may activate and deactivate the light source by activating the proximity switch 22 integrally provided with the lamp assembly 20. The lamp may serve as an interior map or reading lamp to provide interior lighting to the vehicle 10, according to one embodiment. The lamp assembly 20 may also serve as a dome lamp to provide lighting in the interior of the vehicle 10. It should be appreciated that the lamp may serve to provide lighting to the interior of the vehicle for other uses and the lamp assembly 20 may be located elsewhere on the vehicle 10. For example, the lamp assembly 20 may be located in the headliner, a visor, a grab handle, a center console, or elsewhere on the vehicle 10. It should be appreciated that the trim assembly 12 may be located elsewhere on the vehicle, with or without a lamp assembly.

Each proximity switch 22 provided in each lamp assembly 20 is shown and described herein as a capacitive switch, according to one embodiment. Each proximity switch 22 includes a proximity sensor that provides a sense activation field to sense contact or close proximity of an object, such as a user's finger, in close relation to the proximity sensor, such as a tap or swiping motion by a user's finger. Thus, the sense activation field generated by the proximity sensor of each proximity switch 22 is a capacitive field in the exemplary embodiment, and the user's finger has electrical conductivity and dielectric properties that cause a change or disturbance in the sense activation field which is detected in a signal generated from the activation field as should be evident to those skilled in the art. However, it should also be appreciated by those skilled in the art that additional or alternative types of proximity sensors can be used, such as, but not limited to, inductive sensors. Exemplary proximity sensors are described in the Apr. 9, 2009, ATMEL® Touch Sensors Design Guide, 10620 D-AT42-04/09, the entire reference hereby being incorporated herein by reference.

The proximity switches installed in the trim assembly 12 may be configured to control other devices. For example, proximity switches 22 may control any of a number of vehicle devices and functions, such as controlling movement of a sunroof or moonroof 16, controlling movement of a moonroof shade 18, controlling activation of one or more lighting devices, and controlling various other devices and functions. While the lamp assemblies 20 with proximity switches 22 are shown located in an overhead console trim assembly 12, it should be appreciated that the assemblies 20 and proximity switches 22 may be located in other trim assemblies such as a center console, an instrument panel, a steering wheel, a headliner, a door, a pillar, a seat, a grab handle or elsewhere on the vehicle 10.

The proximity switches 22 are shown and described herein as capacitive switches, according to one embodiment. Each proximity switch 22 includes one or more proximity sensors that provide a sense activation field to sense contact or close proximity of a user in close relation to the one or more proximity sensors, such as a tap or swiping motion by a user's finger. Thus, the sense activation field of each proximity switch 22 is a capacitive field in the exemplary embodiment and the user's finger has electrical conductivity and dielectric properties that cause a change or disturbance in the sense activation field as should be evident to those skilled in the art. A signal may be generated based on the activation field and processed to detect a user interaction indicative of a desired user input.

Referring to FIGS. 3-13, the lamp assembly 20 is generally illustrated having an outer lens 32 made of a transparent material and located on the front side. The transparent window of the outer lens 32 is light transmissive to allow visible light waves to pass through the transparent window. A lamp or light source 92 is disposed rearward of the transparent window of the lens 32 to illuminate light forward through the transparent window of the outer lens 32. The light source 92 may include a light emitting diode (LED) mounted to a circuit board 94, according to one embodiment. Other light sources such as an incandescent bulb or combination of one or more light sources may be employed, according to other embodiments. The outer lens 32 may be formed as a separate component and assembled to the trim assembly 12 as shown. The outer lens 32 may be fixedly mounted to the trim assembly 12 via fasteners, adhesive or other mounting connection and generally does not move relative to the trim assembly 12.

The lamp assembly 20 includes a proximity switch 22 having a proximity sensor 24 disposed on the upper surface of the outer lens 32. The proximity switch 22 has the proximity sensor for generating an activation field proximate to the sensing pad 34 formed by the outer lens 32 to sense user activation of the proximity switch 22 to control activation of the light source 30, according to one embodiment. In the embodiment shown, the proximity switch 22 has a single proximity sensor configured to extend centrally on the inner surface of the outer lens 32 to generate an activation field 26 generally across substantially the entire bottom surface of the outer lens 32 defining the sensing pad 34 and below the outer lens 32. The proximity sensor may be made of a substantially visible transparent conductive material such as indium tin oxide (ITO).

It should be appreciated that other forms of capacitive sensors may be employed to generate the activation field. It should be appreciated that the activation field generated by the proximity sensor extends below the sensing pad 34 of the outer lens 32 to enable an object, such as a user's finger, hand or other body part to enter the activation field 26 at the sensing pad to activate the light source 92 on and off. When an object, such as finger sufficiently engages the activation field below the sensing pad 34 of outer lens 32, a disturbance in the activation field is detected such that activation of the proximity switch 22 is initiated so as to either switch the light source on or switch the light source off.

Figure 3:
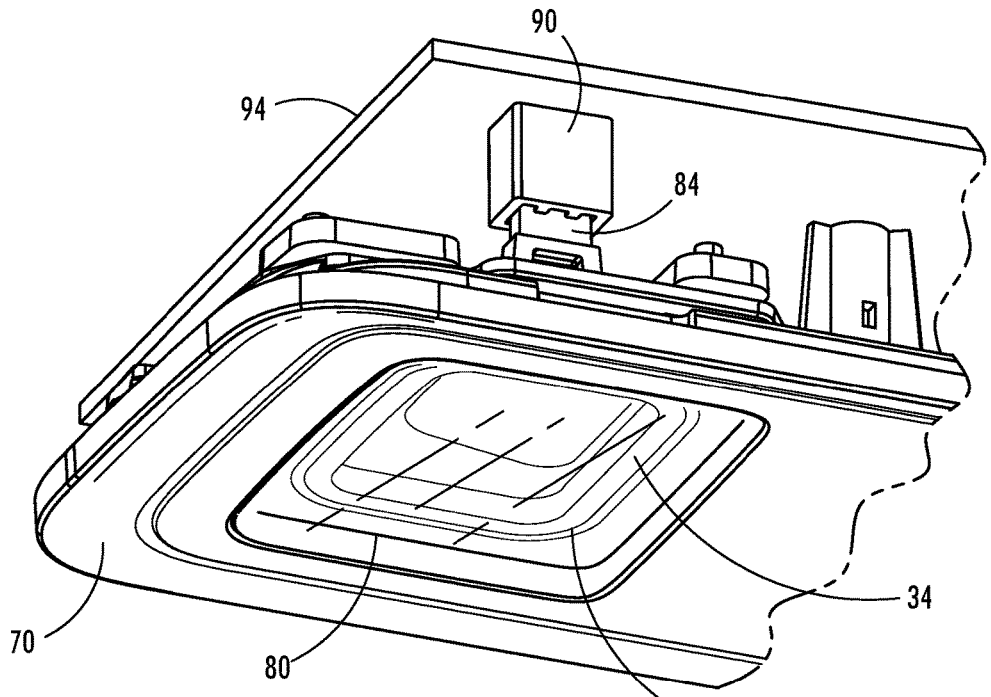
FIG. 3 is a front perspective view of a portion of the trim assembly containing the trim components and one lamp.
Figure 4:
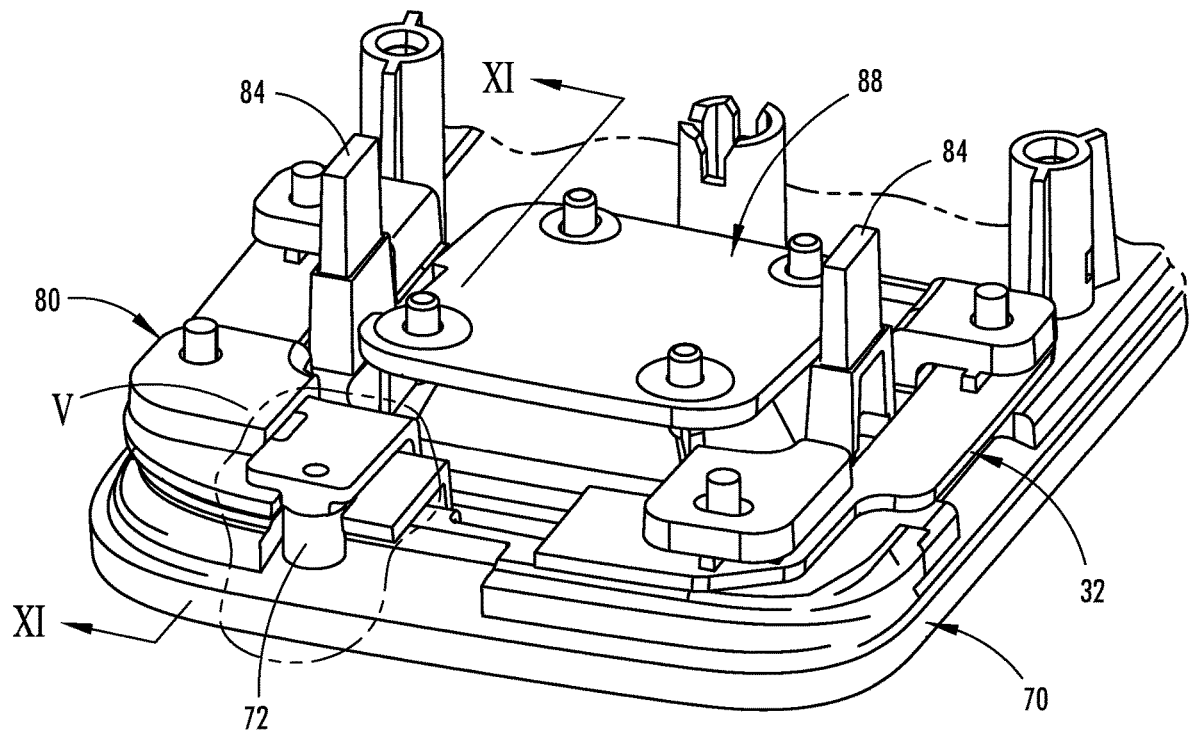
FIG. 4 is a rear perspective view of the trim assembly shown in FIG. 3.
Figure 5:
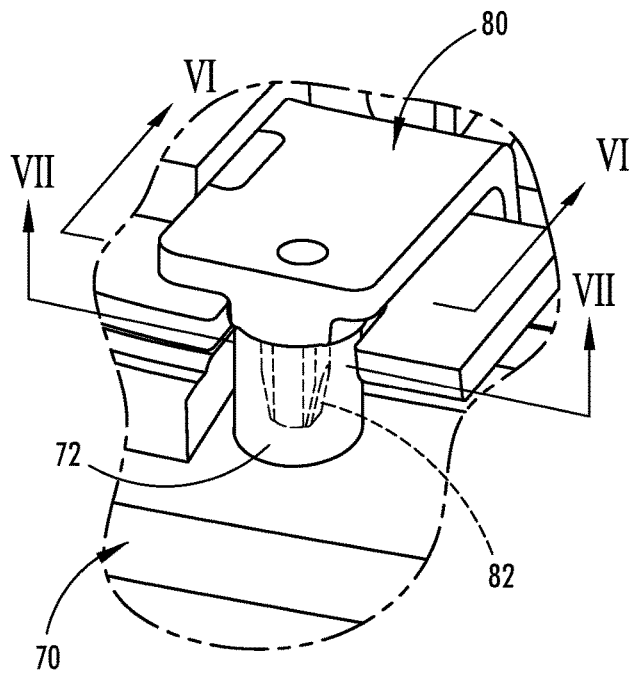
FIG. 5 is an enlarged view of section V of FIG. 4 showing the inner trim component having a conductive connector tower connected to the outer trim component.

Referring to FIGS. 3 and 4, the vehicle console trim assembly 12 is generally illustrated showing a portion thereof including one lamp and the inner and outer decorative chrome trim components 80 and 70, with a surrounding portion of the console removed. The trim assembly 12 has a first or outer decorative chrome trim component 70 which generally extends in a somewhat rectangular ring shape around the pair of lamp assemblies 20 as best seen in FIG. 2. The outer chrome trim component 70 is made of an electrically conductive material that is used to form a decorative metal trim component that is visible on the front side of the trim assembly 12. In the embodiment shown, the outer chrome trim component 70 is shaped as a ring or bezel generally surrounding both lamps 20. In addition, the trim assembly 12 has a pair of individual second or inner chrome trim components 80 which are located above the outer lens 32, respectively, and formed within an outer perimeter portion of the outer lens 32 extending inward in the shape of a rectangular or square ring. As such, the inner chrome trim component 80 is visible from the outside by viewing through the transparent outer lens 32. The outer chrome trim component 70 and inner chrome trim component 80 are mechanically separate from one another on separate chrome plated structures; however, both the outer chrome trim component 70 and inner chrome trim component 80 are electrically grounded by electrically connecting the chrome plating to an electrical ground via a conductive tower connection as described herein. It should be appreciated that the inner and outer trim components 80 and 70 may have other shapes and sizes such as circular rings, broken rings, triangular rings and other shapes.

Figure 12:
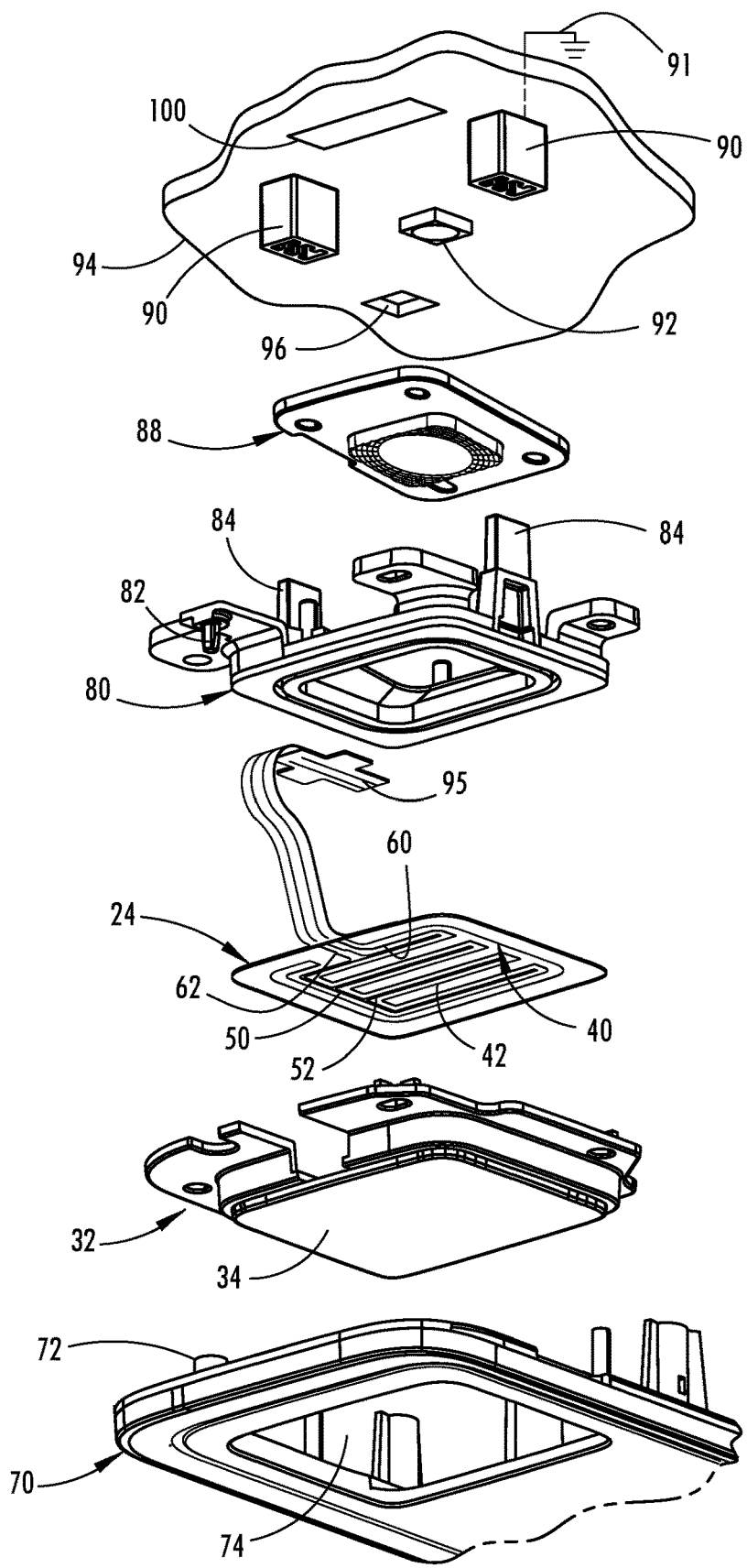
FIG. 12 is an exploded front perspective view of the trim assembly.
Figure 13:
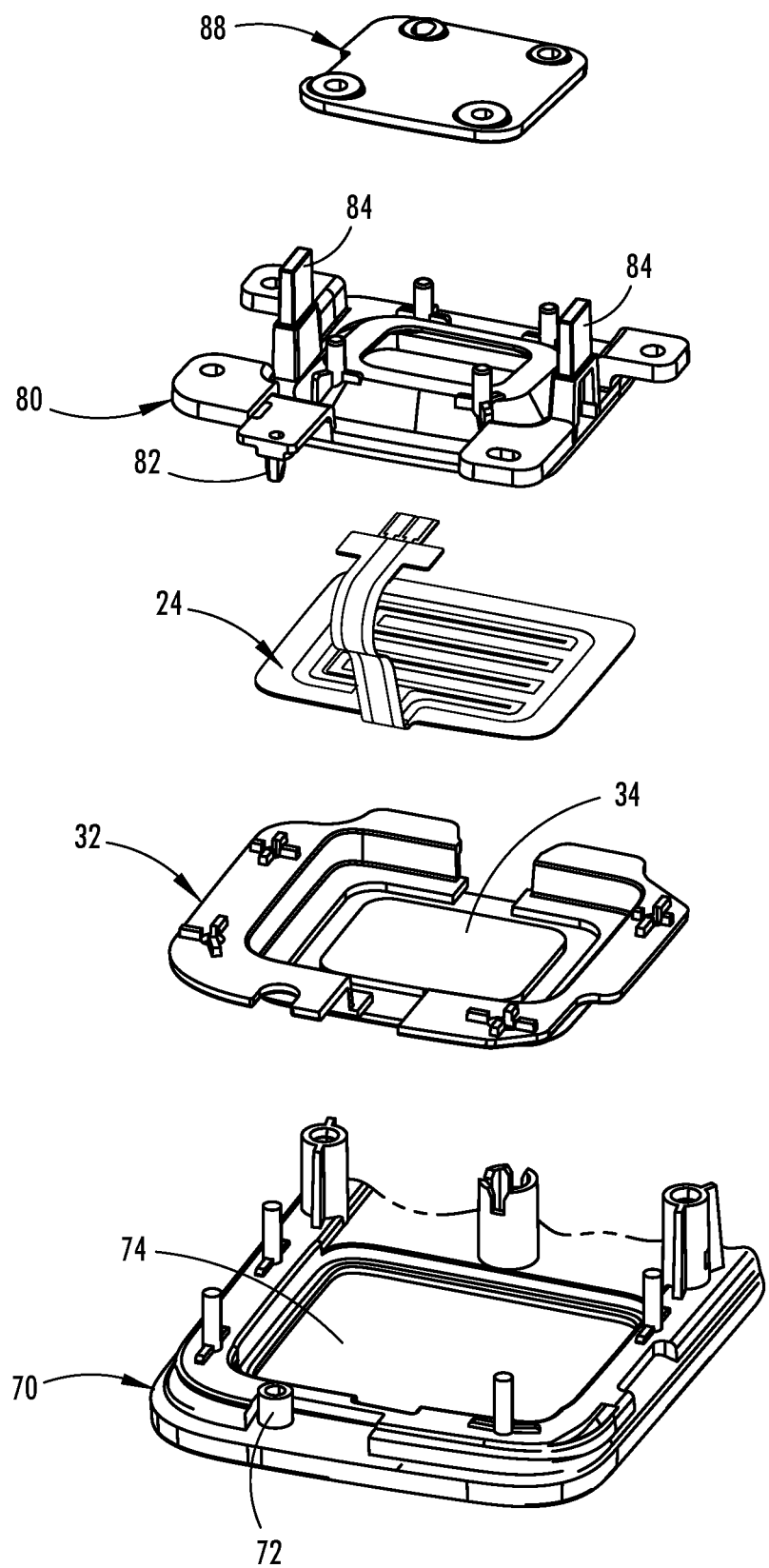
FIG. 13 is an exploded rear perspective view of the trim assembly.

With reference to FIGS. 3-13, the assembly of the console trim assembly 12 is generally illustrated in detail. As best seen in FIGS. 12 and 13, the trim assembly 12 includes the outer chrome plated trim component 70 having a chrome plated surface substantially covering the entire component. The outer chrome plated trim component 70 has a conductive connector cup 72 formed on the rear side extending rearward which is positioned for engagement with a conductive connector tower 82 as shown and described herein. The outer lens 32 is disposed within an opening 74 provided in the outer chromed plated trim component 70. The outer lens 32 fits within the opening 74 to close the opening 74 and to allow light to pass through the transparent outer lens 32. The proximity sensor 24 is formed on the inside surface of the outer lens 32, generally in the region of the sensing pad 34. The proximity sensor 24 generates an electric activation field that generally extends downward across the outer surface of the sensing pad 34 and outward therefrom. The inner chrome plated trim component 80 is assembled into the opening 74 and onto the outer chrome plated trim component to sandwich a peripheral portion of the outer lens 32 and proximity sensor 24 therebetween. As such, the outer lens 34 extends through the opening 74 and may be flush therewith or may extend forward therefrom.

The inner chrome plated trim component 80 includes an inner chrome ring which extends within the opening 74 behind the outer lens 32 so as to provide the second conductive trim component. A conductive connector tower 82 which is formed as a chrome coated piece of the inner chrome plated trim component 80 extends forward and engages an inner conductive surface of the conductive connector cup 72 on the outer chrome plated trim component 70 so as to provide an electrical connection to ground for the outer chrome plated trim component 70 as well as to provide a ground connection between the inner chrome plated trim component 80 and electrical ground. Each of the outer and inner chrome plated trim components 70 and 80 are formed of a chrome coating that is electrically conductive. As such, a substantial portion or all of the outer surface of the outer and inner trim components 70 and 80 allow electricity to pass thereon. The inner chrome plated trim component 80 has a pair of rearward extending towers 84 each of which are configured to engage a respective pair of connectors 90 provided on the front side of a printed circuit board (PCB) 94. The printed circuit board 94 includes a light source, such as a light-emitting diode (LED) 92 provided on the front surface of the printed circuit board 94. An inner lens 88 is disposed between the printed circuit board 94 and the inner chrome plated trim component 80. As such, light emitted from the LED 92 passes through the inner lens 88 and through the outer lens 32 to serve as a lamp.

Additionally, the printed circuit board 94 has a sensor plug connector 96 which enables an electric connection to a connector 95 connected to the proximity sensor 24 which may extend from a flexible circuit. The printed circuit board 94 further has a controller 100 which includes control circuitry and a microprocessor, according to one embodiment, to generate the activation signal and determine sensed proximity of an object such as a user's finger in close proximity to the proximity sensor. The printed circuit board 94 further includes a ground path shown schematically by identifier 91 that enables the grounding of the outer and inner chrome plated trim components 70 and 80 via the electrical path through the conductive connector tower 82, conductive connector cup 72 and the pair of connectors 90.

Referring to FIGS. 12 and 13, the electrode configuration of the proximity sensor 24 is illustrated, according to one embodiment. Proximity sensor 24 shown embodied as a capacitive sensor includes a first electrode 40 having first extending plates or fingers 42, and a second electrode 50 having second extending plates or fingers 52. First electrode fingers 42 are interdigitated with second electrode fingers 52 to provide a capacitive coupling between the first electrode 40 and second electrode 50. The capacitive coupling produces the activation field 26. It should be appreciated that the proximity sensor 24 may otherwise be configured with other electrode and finger arrangements.

The first electrode 40 is coupled to a first signal line 60, while the second electrode 50 is coupled to a second signal line 62. The first and second signal lines 60 and 62 electrically connect via connectors 95 and 96 to circuitry on the circuit board 94. A pulsed drive input signal (e.g., voltage) is applied to one of the signal lines 60 and 62, and an output voltage proportional to the capacitance is received on the other of the signal lines 60 and 62. The input voltage provides a charge coupling on one of the first and second electrodes 40 and 50, while the other of the first and second electrodes 40 and 50 provides a signal indicative of the capacitive coupling between the first and second electrodes 40 and 50. The output signal and the input signal may be processed by control circuitry, such as the controller 100, to determine whether an object, such as a user's finger, is sufficiently interacting with the activation field to activate the proximity switch 22.

The electrically conductive trim components form decorative metal trim components that are visible on the front side of the proximity switch 24 and lamp assembly 20. The outer and inner trim components 50 are made of a decorative metal, such as chrome or aluminum that may serve as a shiny decorative trim component. The trim assembly 12 set forth in the present disclosure advantageously incorporates the decorative and electrically conductive material as trim component pieces that are located near the proximity sensor and are electrically grounded to reduce or prevent signal interference with the proximity sensor 24.

According to one embodiment, the electrically conductive material forming the outer and inner trim components 70 and 80 may be formed of a chrome that is plated onto a thermoplastic or plastic polymer such as a polycarbonate (PC) or acrylonitrile butadiene styrene (ABS) material. The outer and inner trim components 70 and 80 may be formed with a two-shot molding process, according to one embodiment. The outer and inner trim components 70 and 80 may be formed on a housing 44 in a single electroplating process, according to another embodiment. The process may include a vacuum metallization process, according to one embodiment.

The outer and inner conductive trim components 70 and 80 each include a dielectric material 81 forming the core of the component and a chrome plating 85 coated on top of the dielectric material 81. As such, each of the outer and inner conductive trim components 70 and 80 have an electrically conductive layer on the outside that conducts electric current. The inner conductive trim component 80 fits within the opening 74 in the outer trim component 70 such that the forward facing conductive connector tower 82 is snap-fit within the rearward facing conductive connector cup 72 provided on the outer conductive trim component 70. As such, the outer surface of each of the conductive tower 82 and conductive cup 72 physically engage one another to provide an electrical current path therebetween.

Figure 6:
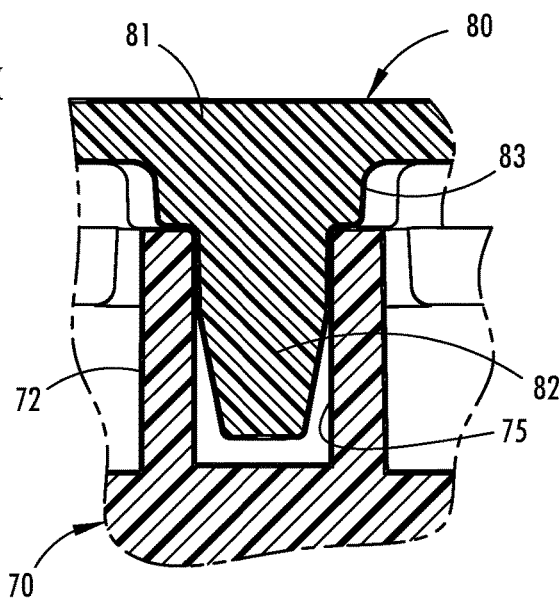
FIG. 6 is a cross-sectional view taken through line VI-VI of FIG. 5.
Figure 7:
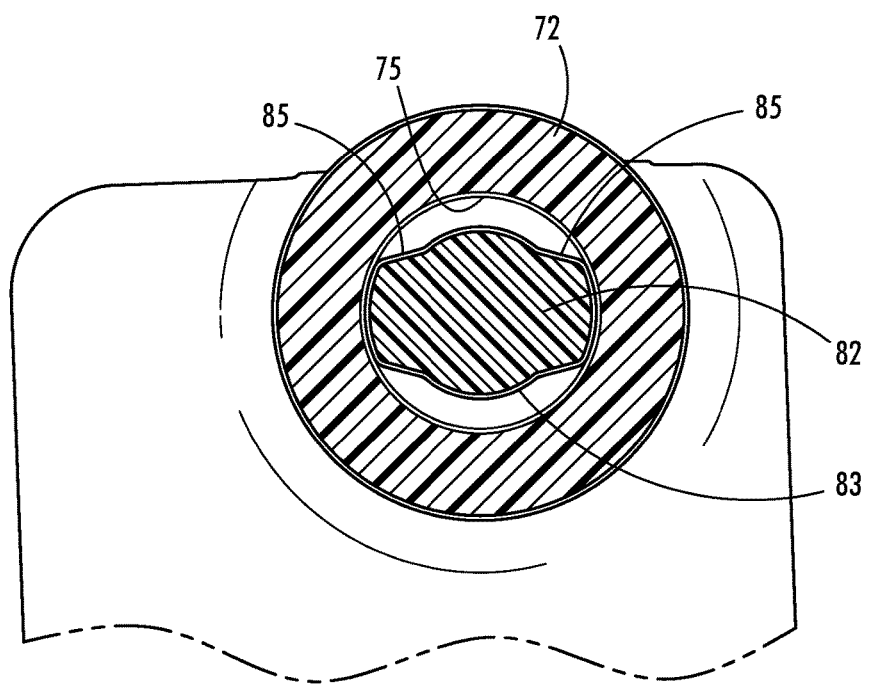
FIG. 7 is a cross-sectional view taken through line VII-VII of FIG. 5.
Figure 11:
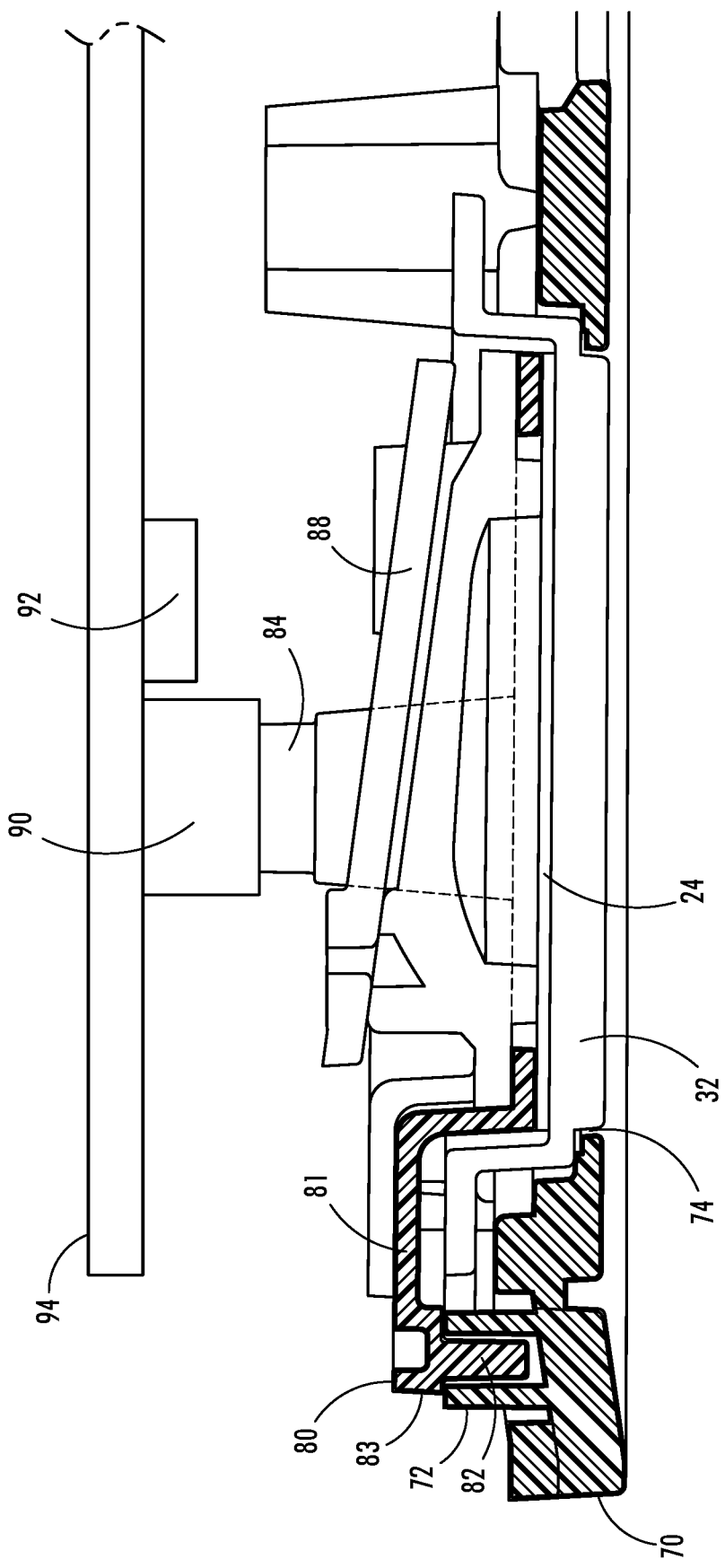
FIG. 11 is a cross-sectional view of the assembly taken through line XI-XI of FIG. 4.

The conductive connector tower 82 is formed to include a plurality of ribs 85 which are tapered as they extend forward or downward as seen in FIGS. 5-10. In the embodiment shown, a pair of ribs 85 are provided on the conductive connector tower 82, located on opposite sides or one hundred eighty degrees (180°) from each other. Each rib 85 has a tapered surface that tapers from the top downward as seen in FIG. 6 which may be tapered at an angle up to forty-five degrees (45°), according to one embodiment, and more particularly in the range of twenty to twenty-five degrees (20° to 25°), according to a specific embodiment. The conductive cup 72 has conductive chrome plated inner vertical side walls for receiving the tower 82. As such, the conductive connector tower 82 is able to effectively snap-fit into the conductive cup 72 during the assembly process with easy alignment and maintain resistive contact for electrical current conduction therebetween.

The entire outer surface of each of the outer and inner trim components 70 and 80 may be chrome plated to allow for electrical signal conduction across the conductive surface for purposes of grounding each of the outer and inner conductive trim components 70 and 80. Alternately, a portion of the outer surface of the conductive trim components 70 and 80 may be chrome plated to provide the grounded signal path. The chrome plated surface provides electrical conductivity between the outer conductive trim component 70 and the conductive inner trim 80 component via the conductive connector tower 82 and conductive connector cup 72. Additionally, the inner conductive trim component 80 provides electrical conductivity through the plated surface of the upward extending towers 84 into circuitry provided on the printed circuitry board 94 which provides a path to electrical ground. As such, when the inner conductive trim component 80 is inserted into the outer conductive trim component, such that the connector tower 82 snap-fits into the conductive can 72 such that the electrical circuit is completed. As such, electrical conductivity is provided connecting the outer and inner conductive trim components 70 and 80 to ground circuitry on the circuit board 94 via the upper extending towers 84.

It should be appreciated that other shapes and sizes and techniques may be employed for providing a signal path extending from the electrodes 40 and 50 to the control circuitry on the circuit board 94. It should further be appreciated that the plated electrical circuitry may be formed using a coring technique in which an area of polymeric material is cored out and plated to provide an electrical signal path therethrough.

According to one embodiment, the electrically conductive material forming the proximity sensor 24 and the outer and inner decorative conductive trim components 70 and 80 is chrome, which may be chrome plated onto a polymeric material. However, it should be appreciated that the decorative material may include other materials that have a shiny metal appearance and are electrically conductive including aluminum.

Figure 14:
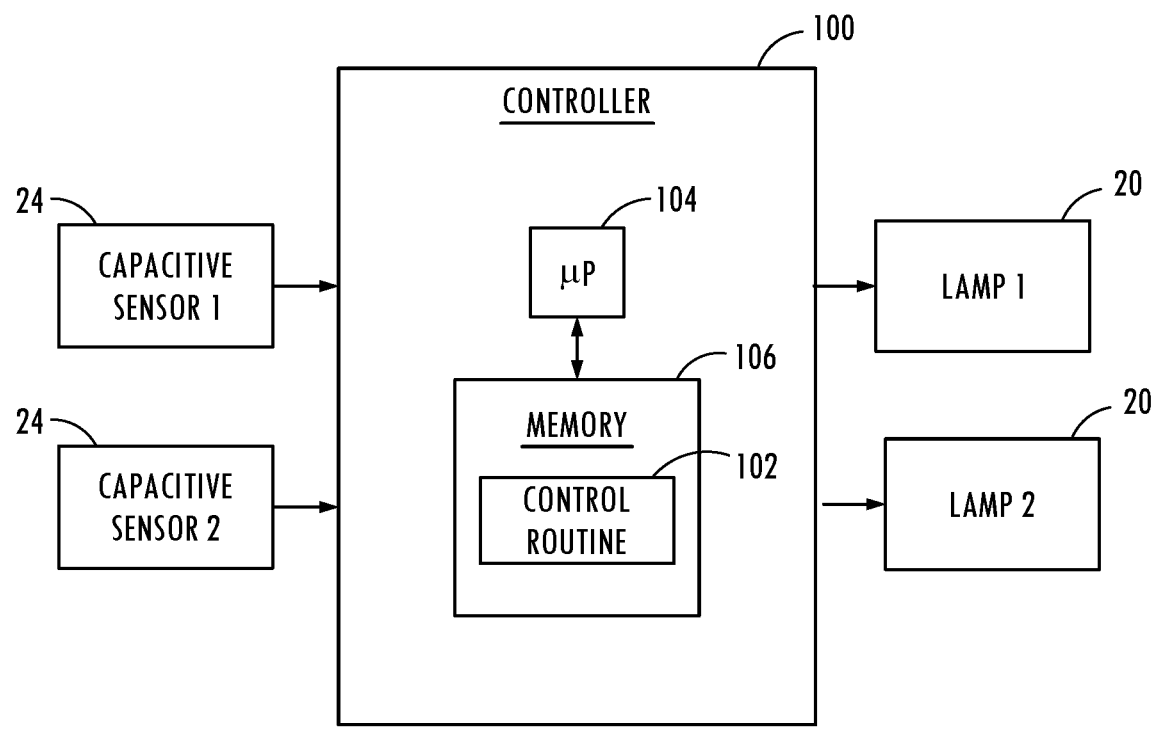
FIG. 14 is a block diagram illustrating controls for controlling the lamps based on user inputs sensed with the proximity sensors.

The proximity switch 20 may include control circuitry as shown in FIG. 14, according to one embodiment. Included is a controller 100 having a microprocessor 104 and memory 106. The controller 100 may execute one or more control routines 102 as is known in the art via the processor 104 to process capacitor sensor inputs from capacitive sensors 24 and control corresponding devices shown as lamp 1 and lamp 2, each labeled lamp 20. The controller 100 may process the capacitive signals sensed by each of the capacitive sensors 24 and compare the sensor values to thresholds to determine activation of the corresponding switch 22 indicative of activating one or more control devices, such as one of the lamps 20.

Accordingly, a vehicle trim assembly 12 is provided that advantageously employs a proximity sensor 24 and first and second conductive trim components 70 and 80 that are grounded so as to prevent interference with the proximity sensor 24. The vehicle trim assembly advantageously employs a conductive tower 82 that allows for the first and second trim components 70 and 80 to be electrically coupled together to form the ground path.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A vehicle trim assembly comprising:
   a proximity sensor;
   a first conductive trim component located near the proximity sensor;
   a second conductive trim component located near the proximity sensor;
   a conductive tower formed on the first conductive trim component and electrically coupled to the second trim component to form a conductive path between the first and the second conductive trim components and electrical ground, wherein the first conductive trim component comprises an inner decorative trim ring and the second conductive trim component comprises an outer decorative trim ring that surrounds the inner decorative trim ring; and
   a conductive cup formed on the second conductive trim component, wherein the conductive tower is matingly received in the conductive cup to provide the electrical coupling.

2. The assembly of claim 1, wherein the inner trim ring substantially surrounds a sensing pad of the proximity sensor.

3. The assembly of claim 1, wherein the conductive tower comprises a plurality of tapered ribs.

4. The assembly of claim 1, wherein the proximity sensor comprises a capacitive sensor.

5. The assembly of claim 1, wherein the proximity sensor is configured as a proximity switch to control a lamp, and wherein the proximity sensor is located on a lens of the lamp and the lens provides a sensing pad.

6. The assembly of claim 1, wherein the first and the second conductive trim components each comprise chrome.

7. The assembly of claim 6, wherein the chrome is chrome plating.

8. A vehicle trim assembly comprising:
   a proximity sensor proximate a sensing pad;
   an inner conductive trim component surrounding the proximity sensor;
   an outer conductive trim component surrounding the inner conductive trim component;
   a conductive tower connecting the inner conductive trim component to the outer conductive trim component to form a conductive path between the inner and the outer conductive trim components and electrical ground, wherein the conductive tower is formed as part of one of the inner and the outer conductive trim components; and
   a conductive cup formed as part of the other of the first and second trim components, wherein the conductive tower connects to the conductive cup to form the conductive path.

9. The assembly of claim 8, wherein the conductive tower comprises a plurality of tapered ribs.

10. The assembly of claim 8, wherein the proximity sensor comprises a capacitive sensor.

11. The assembly of claim 8, wherein the proximity sensor is configured as a proximity switch to control a vehicle lamp.

12. The assembly of claim 11, wherein the proximity sensor is located on a lens of the lamp and the lens provides the sensing pad.

13. The assembly of claim 8, wherein each of the inner and the outer conductive trim components comprise chrome.

14. The assembly of claim 13, wherein the chrome is chrome plating.

15. A vehicle trim assembly comprising:
    a proximity sensor proximate a sensing pad;
    an inner conductive trim component surrounding the proximity sensor;
    an outer conductive trim component surrounding the inner conductive trim component;
    a conductive tower formed on the inner conductive trim component; and
    a conductive cup formed on the outer conductive trim component and electrically connected to the conductive tower to form a conductive path between the inner and the outer conductive trim components and electrical ground.

16. The assembly of claim 15, wherein the inner conductive trim component comprises a trim ring that substantially surrounds the sensing pad and the outer conductive trim component surrounds the inner conductive trim component, wherein the conductive tower is snap-fit into the conductive cup.

* * * * *